(12) United States Patent
Advocate et al.

(10) Patent No.: US 6,451,490 B1
(45) Date of Patent: Sep. 17, 2002

(54) METHOD TO OVERCOME IMAGE SHORTENING BY USE OF SUB-RESOLUTION RETICLE FEATURES

(75) Inventors: William H. Advocate, Staatsburg; Scott J. Bukofsky, Hopewell Junction; Christopher Adam Feild, Yorktown Heights, all of NY (US); Donald J. Samuels, Silverthorne, CO (US)

(73) Assignee: International Business Machines Corporation, Armonk, NY (US)

( * ) Notice: Subject to any disclaimer, the term of this patent is extended or adjusted under 35 U.S.C. 154(b) by 14 days.

(21) Appl. No.: 09/709,091

(22) Filed: Nov. 8, 2000

(51) Int. Cl.[7] .................................................. G03F 9/00
(52) U.S. Cl. .......................................................... 430/5
(58) Field of Search ........................ 430/5, 322; 716/19, 716/21

(56) References Cited

U.S. PATENT DOCUMENTS

| | | | |
|---|---|---|---|
| 5,242,770 A | 9/1993 | Chen et al. | 430/5 |
| 5,795,688 A | 8/1998 | Burdorf et al. | 430/5 |
| 5,821,014 A | 10/1998 | Chen et al. | 430/5 |
| 5,976,733 A | 11/1999 | Hashimoto | 430/5 |
| 6,044,007 A | 3/2000 | Capodieci | 365/120 |

Primary Examiner—S. Rosasco
(74) Attorney, Agent, or Firm—Scully, Scott, Murphy & Presser; Steven Capella

(57) ABSTRACT

Image shortening in a photolithographic process is substantially reduced by using sub-resolution reticle features to alter the aerial image in the shortened regions. The use of such sub-resolution reticle features is simple to implement in a design system, and allows for increased feature aspect ratio as well as overlap to other critical features.

21 Claims, 4 Drawing Sheets

METHOD TO OVERCOME IMAGE SHORTENING BY USE OF SUB-RESOLUTION RETICLE FEATURES

FIELD OF THE INVENTION

The present invention relates to lithography, and more particularly to a method of overcoming image shortening in a photolithographic process wherein sub-resolution reticle features are used to alter the aerial image in the shortened regions.

BACKGROUND OF THE INVENTION

In order to increase the packaging density of various semiconductor devices formed on integrated circuits (ICs), the minimum feature size of the ICs must be reduced. This reduction in minimum feature size causes difficulties in various semiconductor device fabrication processing steps. One such area within the semiconductor device fabrication process which experiences unique challenges as feature size of the IC shrinks is photolithography.

Photolithography is used in the field of IC manufacturing to transfer patterns, i.e., images, from a mask (often called a reticle) containing circuit-design information to thin films on the surface of a Si wafer. The pattern transfer is accomplished with a photoresist (typically an ultraviolet light-sensitive organic polymer). In a typical image transfer process, a Si-wafer coated with a photoresist is illuminated through a mask and the mask pattern is transferred to the photoresist by chemical developers. Further pattern transfer into the underlying substrate is accomplished by using a chemical etchant.

Microphotolithography is employed in the semiconductor industry to form very small patterns (on the order of 0.25 $\mu$m or less) on the surface of a substrate. Because of the limited resolution of current photolithographic tools, i.e., steppers, it is difficult to print dense array patterns in which the length of the individual lines is the same as that on the mask. Oftentimes when dense array patterns are printed, the printed image contains lines that are much shorter than those on the original mask. This problem is known in the art as "image shortening".

The problem of image shortening of dense array patterns such as shown in FIG. 1A will now be described in more detail. Specifically, FIG. 1A shows a desired dense array pattern 10 that is formed on a reticle (not shown). The illustrated pattern of FIG. 1A includes rectangular clear features 12. The pattern illustrated in FIG. 1A is critical in semiconductor manufacturing, and is used in many different technologies such as in the fabrication of a capacitor level in trench-based dynamic random access memory (DRAM) cells, electrode patterns in stacked capacitor DRAMs, and contact arrangements in both DRAMs and microprocessors.

The issue of line shortening is especially important in the above-mentioned applications, where the length of the printed image is critical. However, fundamental-image shortening leads to undesirably short features 12' as schematically shown in FIG. 1B. In this example, the exposure energy is chosen such that the feature width is imaged at the proper dimension. When this is the case, the feature length is much shorter than desired.

The most typical way of dealing with image shortening in dense arrays in prior art processes is by simple mask bias. In this case, the edges of the features on the reticle, i.e., mask, are extended as much as necessary to compensate the image shortening that occurs at the wafer level. As feature size shrinks and packaging density grows, this prior art method will fail because there is simply not enough room between shapes to move edges sufficiently.

Another prior art method to reduce image shortening is to add serifs to the mask features. Serifs are additional features added to the shape ends in order to provide aerial image tailoring. FIGS. 2A–2B are representations of mask serifs for unit cells of two different patterns. The added serifs are labeled as 16, whereas the pattern is labeled as 10. It should be noted that FIG. 2A represents a dark-field mask in which the rectangular features 12 and the serifs are clear features on an opaque background 14. In FIG. 2B, a bright-field mask is shown wherein features 12 and serifs 16 are opaque features on a clear background 14.

The serifs either add or subtract light in the areas where line shortening occurs, tailoring the aerial image in such a way as to compensate the shortening. There are many drawbacks to serifing, however. For example, the additional shapes are very small, making mask inspection and writing difficult, and each shape has multiple serifs added thereto so data volume for the mask gets very large. Furthermore, the efficacy of the added serifs decrease greatly as feature size decreases.

Lastly, it is known in the art that image shortening can be helped somewhat by changing the illumination conditions used to expose the mask. However, the conditions for minimized line shortening are rarely the same as the ones for best resolution, so this is typically not a viable option.

It is emphasized that image shortening is a quite different problem than proximity effects which is the problem of different lines imaging differently depending on their local environment. That is, proximity effect is an optical effect where diffraction causes features to interact with their neighboring feature. This interaction causes the image to print differently in one-dimension, i.e., wrong line width, lower process latitude, etc. The problem of image shortening is not. one-dimensional, rather it is a two-dimensional problem; therefore solutions that work in solving proximity effects do not necessarily work for reducing image shortening.

In view of the drawbacks mentioned hereinabove with prior art methods of reducing image shortening, there is a continued need to develop new and improved methods in which the effect of image shortening in photolithographic processes can be substantially eliminated, thereby printing an image on a semiconductor wafer that has substantially the same length as that of the pattern on the mask.

SUMMARY OF THE INVENTION

One object of the present invention is to provide a method which substantially reduces the image shortening problem typically observed when dense array patterns are printed.

Another object of the present invention is to provide a method of substantially reducing image shortening which is very easy to implement on a mask.

A further object of the present invention is to provide a method of substantially reducing image shortening which is easily inspectible.

A yet further object of the present invention is to provide a method of substantially reducing image shortening wherein no complex rules need to be generated, as is practiced with traditional serif and leveling bar technology.

These and other objects and advantages can be achieved in the present invention by placing sub-resolution reticle features perpendicular to the feature on the mask of interest.

The term "sub-resolution" as used herein denotes an added feature which does not print on the substrate.

Specifically, the method of the present invention which addresses the problem of image shortening in dense array patterns comprises the steps of:

(a) providing a mask having a dense array pattern formed thereon; and (b) adding at least one sub-resolution reticle feature perpendicular to at least one feature of said dense array pattern, wherein each of said sub-resolution reticle features have a width smaller than the at least one feature of said dense array pattern.

In one embodiment of the present invention, the features of the dense array pattern and the added sub-resolution reticle features are clear features formed on an opaque background. Alternatively, the features of the dense array pattern and the sub-resolution reticle features are opaque features formed on a clear background.

In another aspect of the present invention, an improved photomask is provided. Specifically, the improved photomask of the present invention comprises:

a dense array pattern formed on a surface of a mask and at least one sub-resolution reticle feature located perpendicular to at least one feature of said dense array pattern, wherein each sub-resolution reticle feature has a width smaller than the at least one feature of said dense array pattern.

In this aspect of the present invention, the features of the dense array pattern and the added sub-resolution reticle features are clear features formed on an opaque background. Alternatively, the features of the dense array pattern and the sub-resolution reticle features are opaque features formed on a clear background.

BRIEF DESCRIPTION OF THE DRAWINGS

FIG. 1A shows a desired dense array pattern having rectangular features, and FIG. 1B is the actual imaged printed.

FIG. 3A is a dark-field image, whereas FIG. 3B is a bright-field image.

DETAILED DESCRIPTION OF THE INVENTION

Figure 1A:
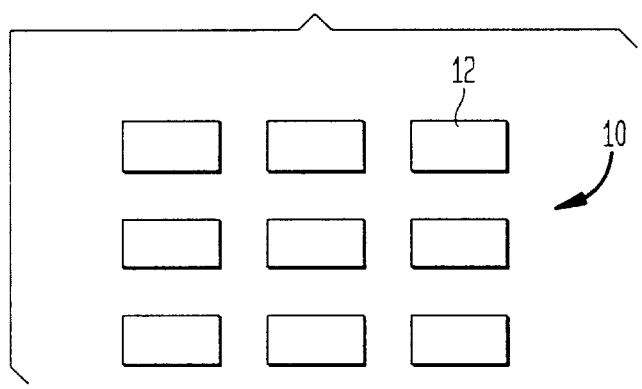
FIGS. 1A–1B are pictorial representations of the problem of image shortening in dense array patterns.
Figure 1B:
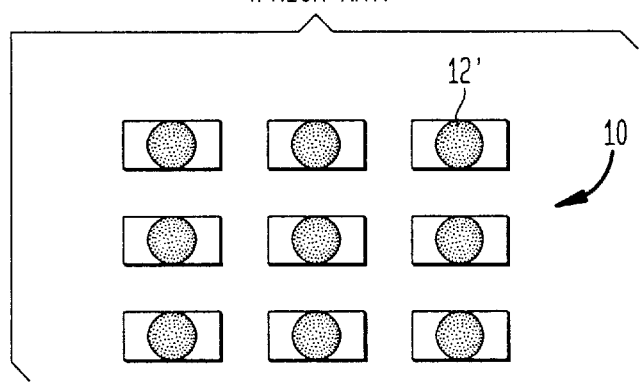
Figure 2A:
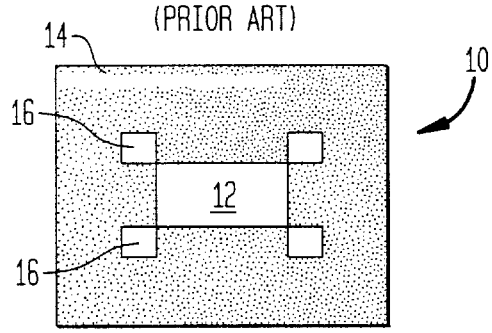
FIGS. 2A–2B are pictorial representations of prior art masks containing serifs.
Figure 2B:
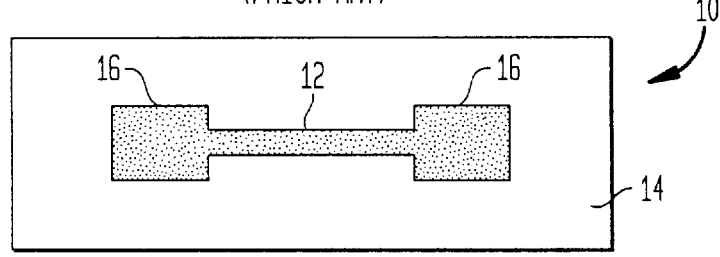

The present invention which provides a method and photomask which are capable of substantially reducing image shortening of printed dense array patterns will now be described in more detail by referring to the drawings that accompany the present application. It should be noted that in the accompanying drawings like and corresponding elements are referred to by like reference numerals.

Before providing details of the present invention, it should be emphasized that the inventive method and photomask can be used in any photolithography process, including microphotolithography, wherein a dense array pattern is to be printed on the surface of a substrate. Thus, any photolithographic process which includes the use of a conventional photoresist, pattern-wise exposure and development of the pattern may, when used in conjunction with the present invention, achieve the benefit of reduced image shortening of the printed image. The inventive method and photomask which provides this benefit are used in the pattern-wise-exposure step of any conventional photolithographic process.

The substrate mentioned above may include any semiconductor chip or wafer which includes at least a semiconductor material such as Si, Ge, GaAs, InAs, InP, other III/V compound semiconductors, layered semiconductors such as Si/SiGe and silicon-on-insulators (SOIs) as well as other material layers that are typically present in a semiconductor structure. The other material layers may include, for example, dielectric layers, wiring layers, conductive layers, and interconnect levels.

Since each of the processing steps used in photolithography are well known, a detailed description of the same is not provided herein. Rather, the following description focuses in on the method of the present invention which, when used in the pattern-wise exposure step of a conventional photolithography process, provides a printed image in which the image shortening effect has been substantially reduced. Thus, images printed using the inventive method and photomask have substantially the same dimensions as that of the desired pattern present on the mask.

Figure 3A:
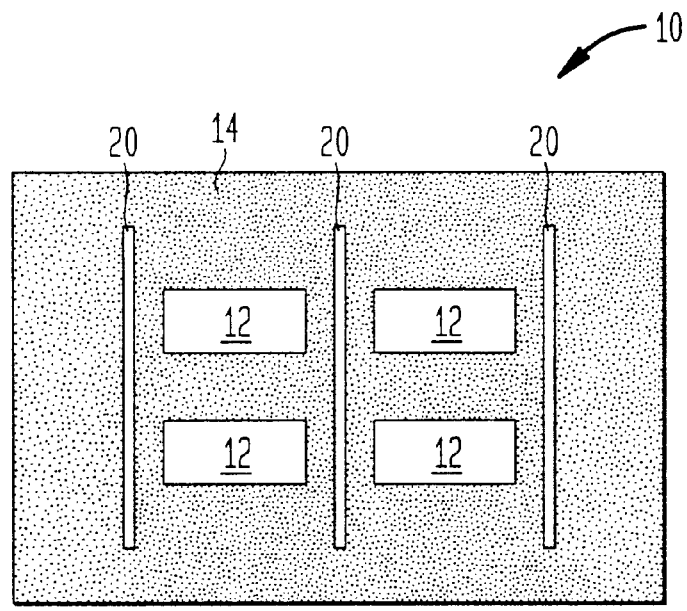
FIGS. 3A–B are representations of the inventive method wherein sub-resolution reticle features are added perpendicular to at least one feature of a dense array pattern.
Figure 3B:
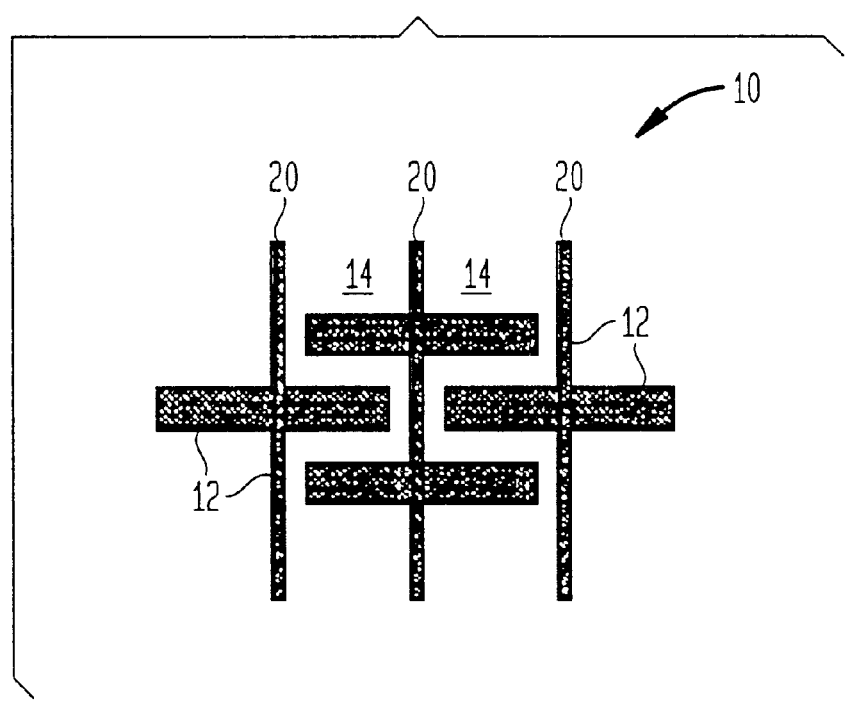

Reference is first made to FIGS. 3A–B which are representations of the inventive method wherein sub-resolution features 20 are added perpendicular to at least one feature 12 of a dense array pattern 10. FIG. 3A is a dark-field image, whereas FIG. 3B is a bright-field image. It should be noted that although the dense array pattern illustrated in the drawings of the present contain rectangular features, the invention is not limited to just rectangular features. Instead, the present invention contemplates any feature shape that can be nested in a dense array pattern. For example, a dense array pattern containing nested squares can be employed in the present invention.

The sub-resolution reticle features of the present invention which are positioned perpendicular to the features of the dense array pattern have a width that is smaller than the corresponding feature of the array pattern. That is, the sub-resolution reticle features have a width that is lower than the resolution capabilities of current photolithographic tools, i.e., steppers. This aspect of the present invention permits the use of the sub-resolution reticle features without printing the same on the surface of the substrate.

The shape of the added sub-resolution reticle feature may be the same or different than the shape of the individual features of the dense array pattern. Thus rectangular-, or square-shaped reticle features may be employed. In accordance with the present invention, the added sub-resolution reticle features may be attached anywhere to the features of the dense array pattern, or alternatively, they can be formed in spaces between the features of the dense array pattern. In some embodiments the sub-resolution features may bisect the features of the dense array pattern.

In one embodiment of the present invention, the features of the dense array pattern and the added reticle features are clear features formed on an opaque background. Alternatively, the features of the dense array pattern and the reticle features are opaque features formed on a clear background.

It should be noted that the patterns of FIGS. 3A–3B would be formed on the surface of a conventional photomask (herein referred to as "mask") which may be made of an opaque material (such as chrome) on quartz or an attenuating phase shift material. Alternatively, the mask is comprised of phase-shifted regions in an alternating phase shift mask. In the drawings, the plane of the paper is intended to represent the surface of a mask in which the depicted patterns are formed thereon.

Moreover, it is noted that the illustrated patterns are, formed on the surface of the mask utilizing conventional processing techniques well known to those skilled in the art.

In the dark-field case illustrated in FIG. 3A, the added sub-resolution reticle features serve to place some additional optical energy in the length direction, which serves to compensate image shortening. In the bright-field case depicted by FIG. 3B, the added sub-resolution reticle features serve to reduce the intensity of the aerial image between the features serving a similar effect as the dark-field case.

Figure 4A:
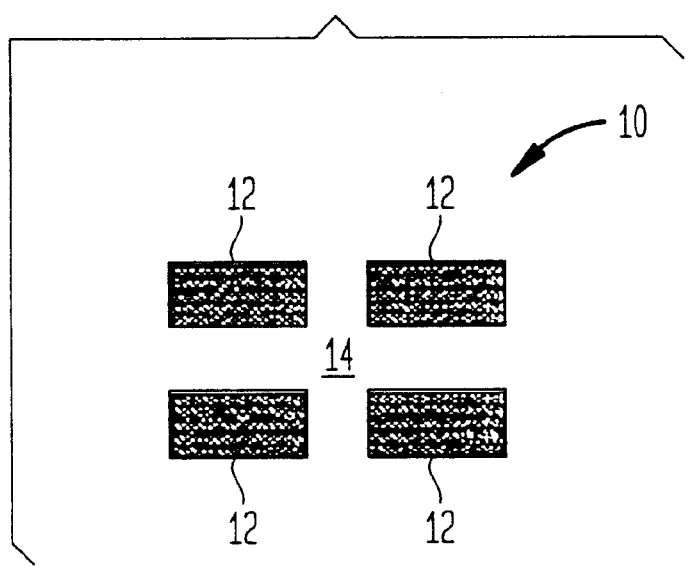
FIGS. 4A–4B are representations of a dense array pattern of a mask without any added sub-resolution reticle features (FIG. 4A; Prior Art) and with added sub-resolution reticle features (FIG. 4B; Invention).
Figure 4B:
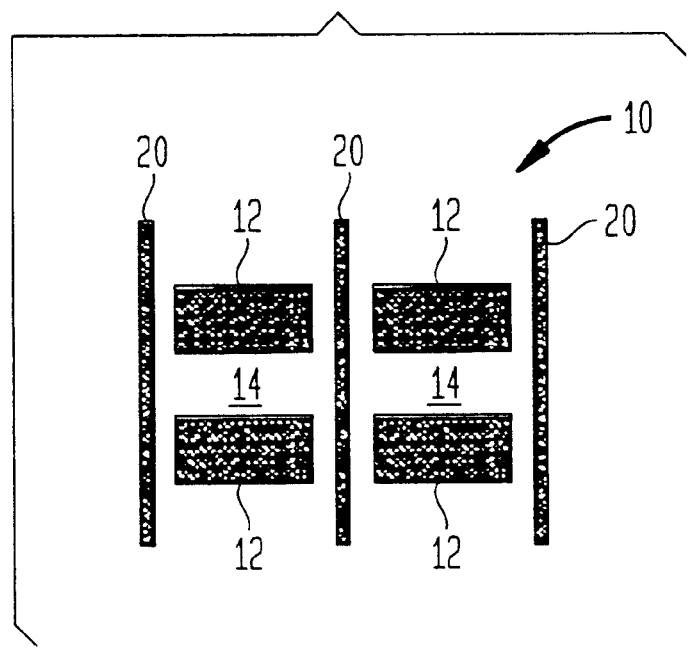

FIGS. 4A–4B are representations of a dense array pattern 10 having rectangular features 12 formed on a surface of a mask without any added sub-resolution reticle features (FIG. 4A) and with added sub-resolution reticle features 20 (FIG. 4B).

Figure 5A:
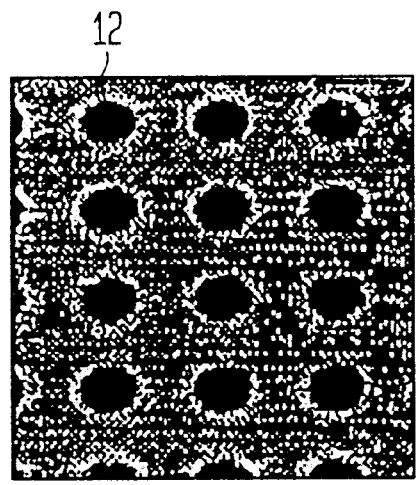
FIGS. 5A–5B are representations of the final image printed for the cases shown in FIGS. 4A and 4B, respectively.
Figure 5B:
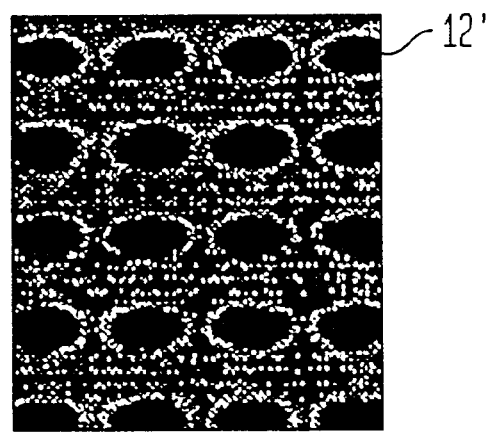

Each of these masks is then used in a conventional photolithography process and the final image 12' printed for the cases shown in FIGS. 4A and 4B are shown in FIGS. 5A and 5B, respectively. It is noted that the top row is a mask design, and the bottom row is the final printed image on the wafer. Note that the maximum length/width ratio achievable using the mask of FIG. 4A with simple mask bias (left column) is 1.4:1. In comparison, the mask containing the added sub-resolution reticle features have a maximum length/width ratio above 2.0. The latter ratio of the printed image is within the ratio of the lines of the dense array pattern on the photomask.

The method of the present invention which is described above provides the following additional advantages:

(1) It is very easy to implement on a photomask; simply adding indefinite lines and spaces to the mask data, as opposed to adding multiple serifs per feature. This keeps data volumes very low.
(2) Ease of inspectibility; the sub-resolution reticle features are much easier to inspect on a mask compared to serifs, using standard methods developed for use with sub-resolution leveling features.
(3) There are no complex rules to generate (number and size of sub-resolution reticle features based on local environment of each shape) as with traditional leveling bar technology used for proximity effect correction.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method for substantially reducing image shortening of printed dense array patterns comprising the steps of:
    (a) providing a mask having a dense array pattern formed thereon; and
    (b) adding at least one sub-resolution reticle feature perpendicular to at least one feature of said dense array pattern, wherein each of said sub-resolution reticle features have a width smaller than the at least one feature of said dense array pattern.
2. The method of claim 1 wherein said mask is comprised of an opaque material on quartz or an attenuating phase shift material.
3. The method of claim 1 wherein said mask is comprised, of phase-shifted regions in an alternating phase shift mask.
4. The method of claim 1 wherein said features of said dense array patterns are rectangular in shape.
5. The method of claim 1 wherein said sub-resolution reticle features are rectangular in shape.
6. The method of claim 1 wherein both of said features are clear features on an opaque background.
7. The method of claim 1 wherein both of said features are opaque features on a clear background.
8. The method of claim 1 wherein said at least one sub-resolution feature is formed from phase-shifted regions in an alternating phase shifted mask.
9. The method of claim 1 wherein said added sub-resolution reticle features are attached to the at least one feature of said dense array pattern.
10. The method of claim 1 wherein said added sub-resolution reticle features are formed in spaces between said at least one feature of said dense array pattern.
11. The method of claim 1 further comprising employing said mask in an exposure step of a photolithography process.
12. A photomask comprising a dense array pattern formed on a surface of a mask and at least one sub-resolution reticle feature located perpendicular to at least one feature of said dense array pattern, wherein each sub-resolution reticle feature has a width smaller than the at least one feature of said dense array pattern.
13. The photomask of claim 12 wherein said mask is comprised of an opaque material on quartz or an attenuating phase shift material.
14. The photomask of claim 12 wherein said mask is comprised of phase-shifted regions in an alternating phase shift mask.
15. The photomask of claim 12 wherein said features of said dense array patterns are rectangular in shape.
16. The photomask of claim 12 wherein said sub-resolution reticle features are rectangular in shape.
17. The photomask of claim 12 wherein both of said features are clear features on an opaque background.
18. The photomask of claim 12 wherein both of said features are opaque features on a clear background.
19. The photomask of claim 12 wherein said at least one sub-resolution feature is formed from phase-shifted regions in an alternating phase shift mask.
20. The photomask of claim 12 wherein said added sub-resolution reticle features are attached to the at least one feature of said dense array pattern.
21. The photomask of claim 12 wherein said added sub-resolution reticle features are formed in spaces between said at least one feature of said dense array pattern.

* * * * *